(12) United States Patent
Fried

(10) Patent No.: US 8,487,633 B2
(45) Date of Patent: Jul. 16, 2013

(54) FAULT DETECTION OF ELECTRIC CONSUMERS IN MOTOR VEHICLES

(75) Inventor: Udo Fried, Waiblingen (DE)

(73) Assignee: SMR Patents S.a.r.l., Luxembourg (LU)

( * ) Notice: Subject to any disclaimer, the term of this patent is extended or adjusted under 35 U.S.C. 154(b) by 400 days.

(21) Appl. No.: 12/983,977

(22) Filed: Jan. 4, 2011

(65) Prior Publication Data

US 2011/0169496 A1 Jul. 14, 2011

(30) Foreign Application Priority Data

Jan. 14, 2010 (EP) .................................. 10150791

(51) Int. Cl.
*G01R 31/00* (2006.01)

(52) U.S. Cl.
USPC .......................................... 324/503; 324/500

(58) Field of Classification Search
USPC .................................................. 324/500, 503
See application file for complete search history.

(56) References Cited

U.S. PATENT DOCUMENTS

| 5,250,849 | A | * | 10/1993 | Periou | 307/10.1 |
| 6,147,498 | A | | 11/2000 | Sumiya et al. | |
| 6,307,376 | B1 | | 10/2001 | Alexander et al. | |
| 7,280,333 | B2 | | 10/2007 | Horsky et al. | |
| 2004/0004483 | A1 | | 1/2004 | Hazelton | |
| 2004/0145838 | A1 | | 7/2004 | Hazelton | |

FOREIGN PATENT DOCUMENTS

DE 102004045435 3/2006

OTHER PUBLICATIONS

European Search Report for applicaiton No. EP 10150791 dated May 11, 2010.

* cited by examiner

*Primary Examiner* — Vincent Q Nguyen
(74) *Attorney, Agent, or Firm* — Reising Ethington PC

(57) ABSTRACT

Fault detection of electric consumers in motor vehicles including at least one electric consumer switchably arranged between a first electric potential and a second electric potential. The electric consumer is switchably connected both to the first and to the second potential. A first switch is arranged between the first potential and the consumer and a second switch is arranged between the second potential and the consumer. The first and the second switch must be closed at the same time in order to operate the consumer. Fault detection is carried out when the device consuming the electricity is visibly off, in that a third electric potential is tapped at a voltage divider arranged parallel to the second switch. Fault detection is carried out by monitoring the third electric potential and the positions of the first and second switches.

10 Claims, 2 Drawing Sheets

FAULT DETECTION OF ELECTRIC CONSUMERS IN MOTOR VEHICLES

The invention is based on a priority patent application EP 10150791.1 which is hereby incorporated by reference.

BACKGROUND ART

1. Field of the Invention

The invention relates to a fault detection arrangement for electric consumers in motor vehicles. More particularly, the invention relates to a fault detection arrangement to detect the function and/or malfunction of an electric consumer in a motor vehicle.

2. Description of the Related Art

In electrical circuits, such as those provided in motor vehicles for operating illumination devices, for example light units, headlights and lamps, for operating actuators, for example electrically adjustable external rear-view mirrors, electric window winders, electric seat adjustment means and electric or electronic locking mechanisms, as well as for operating drive motors, for example of pumps, fans and compressors to name just a few conceivable variants, one or more electric consumers are arranged, the function or unheralded malfunction of which or the unexpected failure of which may be relevant to safety.

It is therefore desirable to monitor the function and/or malfunction and/or failure of electric consumers in the circuit, for example so as to deliver a warning, for example to a driver of a motor vehicle, if a malfunction is expected, if there is a fault that cannot be directly detected visually, or if function is limited. This type of monitoring is generally known as fault detection.

In this instance the fault detection arrangement also increasingly comprises, in addition to an operation monitoring system, an idle monitoring system that detects an expected function or malfunction or a fault whilst the consumer is not operated and is idle. In addition to short circuit and burn-out, it should also be taken increasingly into consideration that an electric consumer could fail not only as a result of its own breakdown, but also as a result of an interruption to the terminal connecting lines (also called terminals for short), this type of failure being referred to as open load. Open load therefore differs from an intentional interruption of the terminal, achieved by a switch, since the consumer is actively separated and disconnected from the power supply by a switch, whereas when the terminal is interrupted there is an unintentional and therefore unforeseeable malfunction of the consumer.

Fault detection of electric consumers is known from U.S. Pat. No. 7,280,333 B2. The fault detection arrangement first determines whether an ohmic consumer or the terminal thereof is operating normally or is defective. If a defective state is determined, the fault detection arrangement then ascertains whether it is a case of open load, a short circuit to ground or a short circuit to supply voltage or phase. The fault detection arrangement further provides for a parameter of the electric consumer to change if a defective state is determined, so as to evade the defective state. For example the direction and/or strength of a current flowing into or out of the ohmic consumer is/are changed. For this purpose the fault detection arrangement comprises a detection circuit that is connected to a measuring point. An electric consumer provided to monitor fault detection is connected to ground at the measuring point. The detection circuit has two comparators, a switch, two variable power sources and a connecting line to the measuring point. The two variable power sources are connected to the connecting line, one of the power sources being variable to ground and the other being variable to supply voltage. The switch is connected on one side to the connecting line. An input of a comparator is connected, in each case, on the other side of the switch in such a way that the two comparators are interconnected via an input and can be connected to the measuring point by the switch, optionally via the connecting line. The remaining free input of one comparator is connected to ground and the free input of the other comparator is connected to supply voltage. In order to determine whether an ohmic consumer or its terminal is operating normally or is defective, the switch is closed so the comparators are connected to the measuring point. The comparators therefore monitor whether the voltage of the measuring point lies below a lower threshold value or above an upper threshold value. The outputs are read, a fault-free, normal operating state being present if the outputs of both comparators are low or zero, and a defective state being present if one of the outputs is high or one. If a defective state is determined, it is ascertained whether it is a case of open load, a short circuit to ground or a short circuit to supply voltage or phase by a change to a predetermined direction and a predetermined strength of a current flowing into or out of the measuring point caused by the variable power sources. If the switch is closed the comparators therefore again monitor whether the voltage of the measuring point lies below the lower threshold value or above the upper threshold value. If the voltage lies below the lower threshold value the ohmic consumer is short-circuited to ground. If the voltage lies above the upper threshold value it is attempted to allow current to flow into the measuring point so as to allow the voltage of the measuring point to fall below the upper threshold value. If this works, it is a case of open load. If this fails to work and the voltage remains above the upper threshold value, the consumer is short-circuited to supply voltage.

A drawback of this is the high cost of both the detection circuit, with its many complex and expensive components, and the temporal and logical control of the components in the detection circuit and of the interrogation algorithms for carrying out and evaluating the two-stage fault detection process.

A fault detection system comprising a comparatively simple switch is known from DE 10 2004 045 435 B4. In this instance the current or power consumption of an electric consumer is monitored and, by comparison with an upper, a middle and a lower threshold value, it is decided whether a short circuit is present, a light bulb is operated as a consumer, a light diode is operated as a consumer or whether there is no current flowing and therefore the consumer is burnt-out. For this purpose the upper threshold value is set at 50 W, above which the presence of a short circuit is assumed. The middle threshold value is set at 10 W, light bulb operation being assumed with a power consumption between 10 W and 50 W. The lower threshold value is 0.1 W, light diode operation being assumed with a power consumption between 0.1 W and 10 W. A defect of the electric consumer is assumed below a power consumption of 0.1 W. The aim of fault detection is to connect an electric resistor during light diode operation, for example of a repeat indicator light of a motor vehicle, in such a way that, without the need for retrofitting measures or with any usability of light diodes or light bulbs from the perspective of a control device of the motor vehicle, a sufficiently high amount of power is taken up so as to assume normal light bulb operation and still detect a fault caused by short circuit or burn-out or malfunction.

A considerable drawback of this fault detection arrangement is the high level of power dissipation, for example until a short circuit is detected.

A fault detection arrangement is known from DE 10 2008 042 595 B3 and also uses light diodes as lighting means in existing motor vehicles, without having to carry out any retrofitting measures. However, in this instance power dissipation of conventional lighting means is not produced by a resistor, which simply burns the power not required, but power dissipation is instead simulated, the electric power not required to operate light diodes, for example, compared to light bulbs being withdrawn from the onboard supply of a motor vehicle at one point and fed back at another point.

Drawbacks of this fault detection system include the high levels of current flowing together with a correspondingly expensive dimensioning of the electric terminal connecting lines.

US20040004483 A1 discloses a circuit comprising two switches and a voltage divider arranged parallel to the two switches. Fault detection is achieved by comparing a plurality of potentials in a comparator.

US20040145838 A1 discloses a circuit in which a large number of potentials are tapped via a plurality of switches in order to detect engine failure.

SUMMARY OF THE INVENTION

An object of the invention is to develop a fault detection arrangement for any electric consumer in a motor vehicle, which arrangement is able to detect all fault types and can be constructed and operated in a simple and cost-effective manner.

The object is achieved by an arrangement for fault detection of electric consumers in motor vehicles comprising at least one electric consumer switchably arranged between a first electric potential and a second electric potential, the electric consumer being switchably connected both to the first and to the second potential, a first switch being arranged between the first potential and the consumer and a second switch being arranged between the second potential and the consumer, and the first and second switches having to be closed at the same time in order to operate the consumer, characterized in that the first switch comprises a current monitoring circuit and fault detection is carried out when the consumer is visibly off, in that a voltage divider for tapping a third electric potential is arranged parallel to the second switch and fault detection is determined by evaluating the third electric potential and the positions of the first and second switches.

A fault detection arrangement for electric consumers in motor vehicles therefore provides at least one electric consumer, which is switchably arranged between two different electric potentials—a first electric potential and a second electric potential. The electric consumer is switchably connected both to the first and to second potential. A first switch is arranged between the first potential and the consumer and a second switch is arranged between the second potential and the consumer. The first and second switches must be closed at the same time in order to operate the consumer. Fault detection is carried out when the consumer appears to be off. A voltage divider is arranged parallel to the second switch, a third electric potential being tapped at said voltage divider. This third electric potential acts as a monitoring variable and is monitored for fault detection. Fault detection is carried out by monitoring the third electric potential, acting as a monitoring variable, and the positions of the first and second switches.

It is important to point out that with regard to the expressions first, second and third potential, and first and second switch as well as other general use, the terms first, second and third do not denote a sequence but are merely used for differentiation and may be exchanged as desired.

Advantages obtained with the invention include the fact that a circuit arrangement required for this purpose can be produced at low cost.

The fault detection arrangement preferably identifies the following different fault types a) open load;

b) consumer-side short circuit of the first switch to the second potential or short-circuit of the connection between the first switch and the consumer to the second potential, for example if a current flowing through a closed first switch exceeds a predetermined current threshold value;

c) short circuit between the first and the second switch or short circuit of the connection between the first switch and the consumer to the connection between the second switch and the consumer, for example if, when the first and second switches are closed, a current flowing through the first switch exceeds the predetermined current threshold value, or if, when the first switch is closed and the second switch is open, the voltage of the third potential relative to the second potential lies above a predetermined first voltage threshold value, which for example may correspond to the voltage of the first potential relative to the second potential minus a voltage divider-specific voltage drop;

d) consumer-side short circuit of the first switch to the first potential or short circuit of the connection between the first switch and the consumer to the first potential, for example if the first and second switches are open and the voltage of the third potential relative to the second potential lies above a predetermined second voltage threshold value, which for example may correspond to the voltage of the first potential relative to the second potential minus a consumer-side voltage drop and minus a voltage divider-specific voltage drop;

e) consumer-side short circuit of the second switch to the second potential or short circuit of the connection between the second switch and the consumer to the second potential, for example if the first switch is closed and the second switch is open and the voltage of the third potential relative to the second potential lies below a predetermined third voltage threshold value;

f) consumer-side short circuit of the second switch to the first potential or short circuit of the connection between the second switch and the consumer to the first potential, for example if the first and second switches are open and the voltage of the third potential relative to the second potential lies above the first voltage threshold value, which for example corresponds to the voltage of the first potential relative to the second potential minus a voltage divider-specific voltage drop.

A reactance may be arranged between the third potential and the second potential.

The voltage divider is dimensioned in such a way that a current flowing through the voltage divider lying parallel to the second switch and through the reactance optionally arranged between the third and second potential is not sufficient to operate the electric consumer, at least in a manner that is visibly recognizable, this consumer, starting from the idle or off state present by the open first and second switches, therefore visibly remaining in the off or idle state by closing the first or second switch. For example in the case of a lighting means, such as a light diode, this means that the lighting means is not illuminated in a visibly recognizable manner. For example in the case of an electromotor, this means that a rotor of the electromotor is not rotating and remains stationary.

The total electrical resistance of the voltage divider is preferably 50 kΩ. The ohmic resistance of the voltage divider is, in this instance, particularly preferably 50 kΩ. A high resistance such as this ensures that the electric consumer remains idle during fault detection by tapping the third potential. The current flowing through the voltage divider is therefore also limited to such a low value that there are practically no losses.

The electric consumer may be an ohmic consumer or may comprise a consumer of this type. An ohmic consumer is an electric consumer, of which the electrical resistance is independent of voltage, current strength and frequency. Ohm's law applies to ohmic consumers for any voltages, currents and frequencies. In a current-voltage diagram the voltage applied across the current strength flowing through the ohmic consumer forms a line through origin.

An electric consumer configured as an ohmic consumer may, for example, comprise one or more light diodes connected in series.

Open load is preferably recognized in the ohmic consumer in that the first switch is closed and the second switch is open. If the voltage of the third potential relative to the second potential lies below the predetermined third voltage threshold value, then there is open load. If the voltage of the third potential relative to the second potential lies above the predetermined second voltage threshold value, then there is no open load and the terminal is fine.

Alternatively or additionally, the electric consumer may be an inductive consumer or may comprise a consumer of this type. An inductive consumer has an electric property, also known as self-inductance, self-inductivity or self-induction, which makes it possible to generate a magnetic field if there is a change in the electric current flowing through the inductive consumer, this magnetic field counteracting the change in current.

An electric consumer configured as an inductive consumer may, for example, comprise one or more electro-motors.

Open load may be detected in an inductive consumer by monitoring a change in the voltage of the third potential relative to the second potential when there is a change in the current through the electric consumer, for example caused by closing or opening the first or second switch. For example there is thus open load if, when the second switch is open, the first switch is closed and the voltage of the third potential relative to the second potential remains unchanged when the first switch is subsequently opened, whereas, in contrast, the terminal is fine and there is no open load if, again starting from an open second switch, the first switch is closed and the voltage of the third potential relative to the second potential increases, at least momentarily, when the first switch is subsequently opened.

The first switch may comprise a current monitoring circuit. For example the first switch may be what is known as an intelligent switch comprising a current monitoring circuit. It is also conceivable for the first switch to be part of a constant current source supplied from the first potential. The current monitoring circuit may comprise a circuit breaker. A consumer-side short circuit of the first switch to the second potential may, in this case for example, be detected by a circuit breaker of the current monitoring circuit when the first switch is actuated and the second switch is not actuated. A short circuit between the first and second switches may also be detected by the circuit breaker of the current monitoring circuit when the first and second switches are closed. In both instances the circuit is therefore preferably broken when the current threshold value is exceeded.

A plurality of electric consumers may be switchably connected to the second potential in a plurality of parallel branches, each comprising a first switch, via a common second switch. In this instance fault detection of various fault types is carried out sequentially from branch to branch. It is therefore conceivable that different electric consumers, for example different types of electric consumer such as ohmic consumers and inductive consumers, are arranged in the different branches. Different current and/or voltage threshold values may therefore be associated with the individual branches.

Further features of the invention will emerge from the further claims, the description and the drawings.

BRIEF DESCRIPTION OF THE DRAWINGS

The invention will be described in greater detail hereinafter with reference to the embodiments illustrated in the drawings, in which like reference numerals are used to denote like or operatively-like components, and in which.

DETAILED DESCRIPTION OF THE PREFERRED EMBODIMENT

Figure 1:
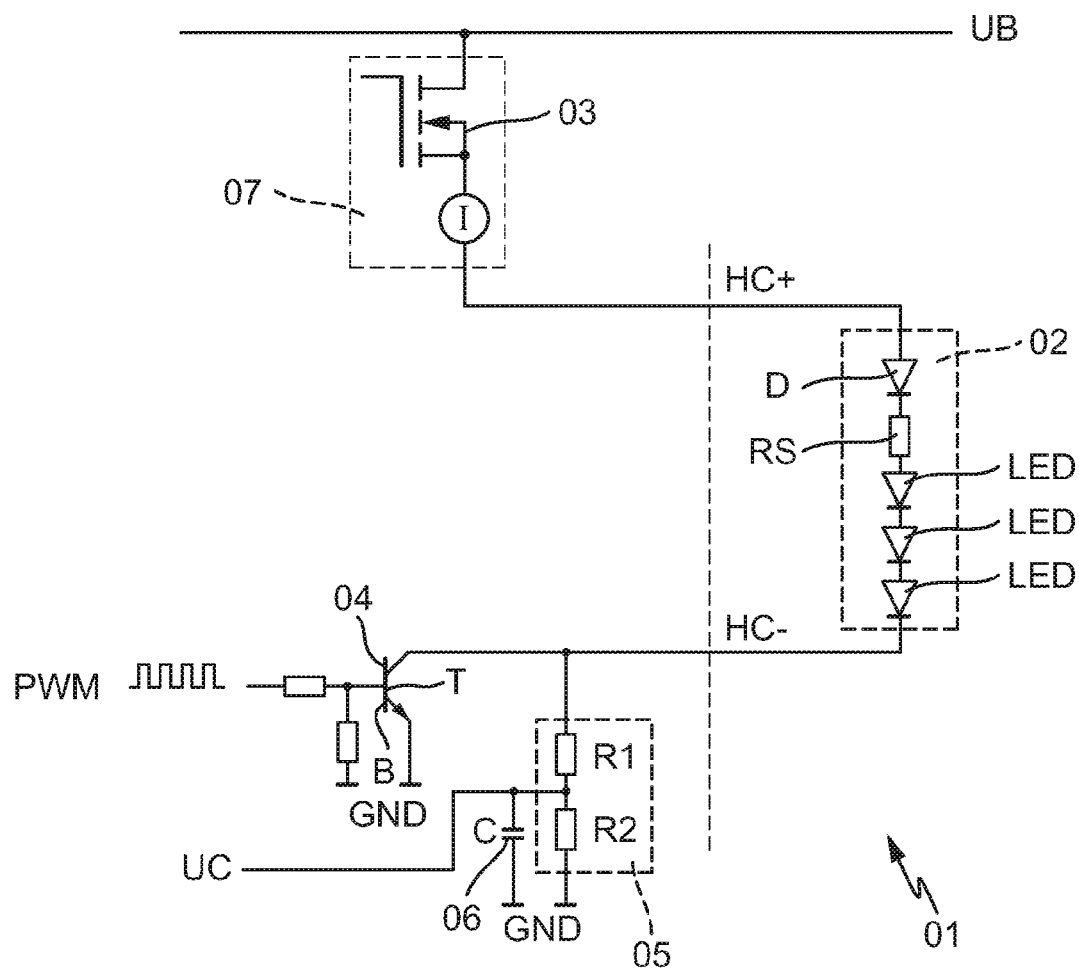
FIG. 1 is a schematic representation of a circuit arrangement of a first embodiment of a fault detection arrangement.

A fault detection arrangement according to the invention is illustrated, for example, by a circuit arrangement 01 shown in FIG. 1. The circuit arrangement 01 detects faults in a plurality of lighting means provided as light sources in order to provide a lighting function of a motor vehicle (not shown in greater detail) and configured as light diodes LED. Three light diodes LED are connected in series to a branch 02. A protective circuit consisting of a blocking diode D and a protective resistor RS may be integrated into the branch 02. The branch 02 of the circuit arrangement 01 is representative of any electric consumer in a circuit. The branch 02 can be switchably arranged between a first electric potential UB, for example of an onboard power supply, and a second electric potential GND, for example an onboard supply unit. The branch 02 is switchably connected both to the first potential UB and to the second potential GND. A first switch 03 is arranged between the first potential UB and the branch 02 and a second switch 03 is arranged between the second potential GND and the branch 02. The first switch 03 and the second switch 04 must be closed or actuated at the same time in order to operate the light diodes LED of the branch 02. The second switch 04 may be configured as a transistor T, of which the base B may be loaded, for example with a pulse-width modulated switch signal PWM, shown schematically. If the first switch is 03 closed, the luminosity of the light diodes LED of the branch 02 may be adjusted continuously, depending on the pulse width, starting from the idle state until reaching the maximum power consumption and luminosity in the lit state.

Fault detection is carried out when the branch 02 is visibly off, the light diodes LED not being illuminated in a manner visible to the human eye or in a recognizable manner. A voltage divider 05 is arranged parallel to the second switch 04 for this purpose. It consists, for example, of two ohmic resistors R1 and R2 connected in series. The ohmic resistance of the voltage divider 05 produced from the individual resistances of the ohmic resistors R1 and R2 is preferably from $10^4$ to $10^5 \Omega$, for example 50kΩ in size. A current flowing through the branch 02 between the first potential UB and the second potential GND is therefore so small that the light diodes LED of the branch 02 are not illuminated in a manner visible to the human eye or in a recognizable manner and stay, at least visibly, in the off state or idle state. A third electric potential UC is tapped at the voltage divider 05. A reactance 06, for example formed by a capacitor C, may be arranged between the third potential UC and the second potential GND.

The first switch 03 may comprise a current monitoring circuit I having a circuit breaker. For example the first switch 03 may be part of an intelligent switch 07, which comprises the current monitoring circuit I having a circuit breaker.

Fault detection is carried out by monitoring the third electric potential UC and the positions of the first switch 03 and the second switch 04.

Fault detection may identify the following different fault types
 a) open load,
 b) consumer-side short circuit of the first switch 03 to the second potential GND,
 c) short circuit between the first switch 03 and the second switch 04,
 d) consumer-side short circuit of the first switch 03 to the first potential UB,
 e) consumer-side short circuit of the second switch 04 to the second potential GND, and
 f) consumer-side short circuit of the second switch 04 to the first potential UB.

A consumer-side short circuit of the first switch 03 to the second potential GND or a short circuit of the connection, denoted by HC+, between the first switch 03 and the branch 02 to the second potential GND may, for example, be detected if, when the first switch 03 is closed, a current flowing through the first switch 03 or through the current monitoring circuit I thereof exceeds a predetermined current threshold value, irrespective of the position of the second switch 04. The current measured by the current monitoring circuit I thus exceeds the predetermined current threshold value, both when the second switch 04 is open and closed. For example the second switch 04 is therefore preferably opened and closed repeatedly if the current measured by the current monitoring circuit I exceeds the current threshold value. If the current measured by the current monitoring circuit I remains greater than the predetermined current threshold value, both when the second switch 04 is open and when it is closed, then there is a short circuit of the connection HC+ to the second potential. A consumer-side short circuit of the first switch 03 to the second potential GND can be detected by the current monitoring circuit I having a circuit breaker and also by a circuit breaker of the intelligent switch 07 when the first switch 03 is actuated and the second switch 04 is not actuated.

A short circuit between the first switch 03 and the second switch 04 or a short circuit of the connection, denoted by HC+, between the first switch 03 and the branch 02 to the connection, denoted by HC−, between the second switch 04 and the branch may, for example, be detected if, when the first switch 03 is closed and the second switch 04 is closed, a current flowing through the first switch 03 or through the current monitoring circuit I of the first switch 03 exceeds the predetermined current threshold value. For example a short circuit between the first circuit 03 and the second switch 04 may also be detected by the circuit breaker of the current monitoring circuit I of the intelligent switch 07 when the first switch 03 is closed and the second switch 04 is closed. Alternatively or additionally, a short circuit may be detected between the first switch 03 and the second switch 04 if, when the first switch 03 is closed and the second switch 04 is open, the voltage of the third potential UC relative to the second potential GND lies above a predetermined first voltage threshold value, which for example may correspond to the voltage of the first potential UB relative to the second potential GND minus a consumer-specific minimum voltage drop. For example in the case of light diodes LED, the minimum voltage drop is 1.7 V for each light diode LED, the protective diode having a minimum voltage drop of, for example, 0.3 V to 0.7 V. The consumer-specific minimum voltage drop may, for example, be 5 V. The first voltage threshold value can be dynamically adapted to fluctuations in the onboard supply by monitoring the onboard supply voltage, which corresponds to the voltage of the first potential UB relative to the second potential GND.

A consumer-side short circuit of the first switch 03 to the first potential UB or a short circuit of the connection HC+ between the first switch 03 and the branch 02 to the first potential UB can be detected if, when the first switch 03 is open and the second switch 04 is open, the voltage of the third potential UC relative to the second potential GND lies above a predetermined second voltage threshold value, which for example corresponds to the voltage of the first potential UB relative to the second potential GND minus a consumer-specific voltage drop and minus a voltage divider-specific voltage drop. In motor vehicle applications a typical value for the second voltage threshold value is, for example, 3.5 V, and this value may be higher in commercial vehicle applications. The second voltage threshold value may also be dynamically adapted to fluctuations in the onboard power supply by monitoring the onboard supply voltage.

A consumer-side short circuit of the second switch 04 to the second potential GND or a short circuit of the connection HC− between the second switch 04 and the branch 02 to the second potential GND may, for example, be detected if the first switch 03 is closed and the second switch 04 is open and the voltage of the third potential UC relative to the second potential GND lies below a predetermined third voltage threshold value. In motor vehicle applications a typical value for the third voltage threshold value is, for example, 1.0 V, and again this value may be higher in commercial vehicle applications. In this instance the current monitoring circuit I of the first switch neither indicates an open load state, nor measures a current exceeding the predetermined current threshold value. If the electric consumer is intact or the light diodes LED in the branch 02 are intact, the consumer will enter the operating state or the light diodes LED will illuminate when the first switch is closed, irrespective of whether the second switch 04 is open or closed.

A consumer-side short circuit of the second switch 04 to the first potential UB or a short circuit of the connection HC− between the second switch 04 and the branch 02 to the first potential UB can be detected if both the first switch 03 and the second switch 04 are open and the voltage of the third potential UC relative to the second potential GND lies above the first voltage threshold value.

Since the light diode LED, a protective diode D and a branch 02 comprising a protective resistor RS are an ohmic consumer, or since the branch 02 comprises an ohmic consumer, open load may be detected if the first switch 03 is closed and the second switch 04 is open. If the voltage of the third potential UC relative to the second potential GND lies below the predetermined third voltage threshold value, there is open load. If the voltage of the third potential UC relative to the second potential GND lies above the predetermined second voltage threshold value, there is no open load and the terminal comprising the connections HC+ and HC− of the branch 02 forming the electric consumer in the circuit is fine. It is important to point out that in the case of open load a current monitoring circuit I arranged in the first switch 03 measures neither a current exceeding the predetermined current threshold value, nor the current flowing through the voltage divider 05.

The first switch 03, optionally equipped with the current monitoring circuit I and therefore also denotable as an intelligent switch, may, in the case of open load, emit a signal, for example that can be evaluated by an evaluation circuit, either in the transmitted sense or with an actual configuration of the circuit arrangement 01, this signal acting, for example, as what is known as a flag. The flag is preferably created when there is open load and is not issued if there is no open load. Alternatively or additionally, it is conceivable for the intelligent first switch 03 to emit a further signal acting as a further flag if the current measured by the current monitoring circuit I exceeds the predetermined current threshold value.

Figure 2:
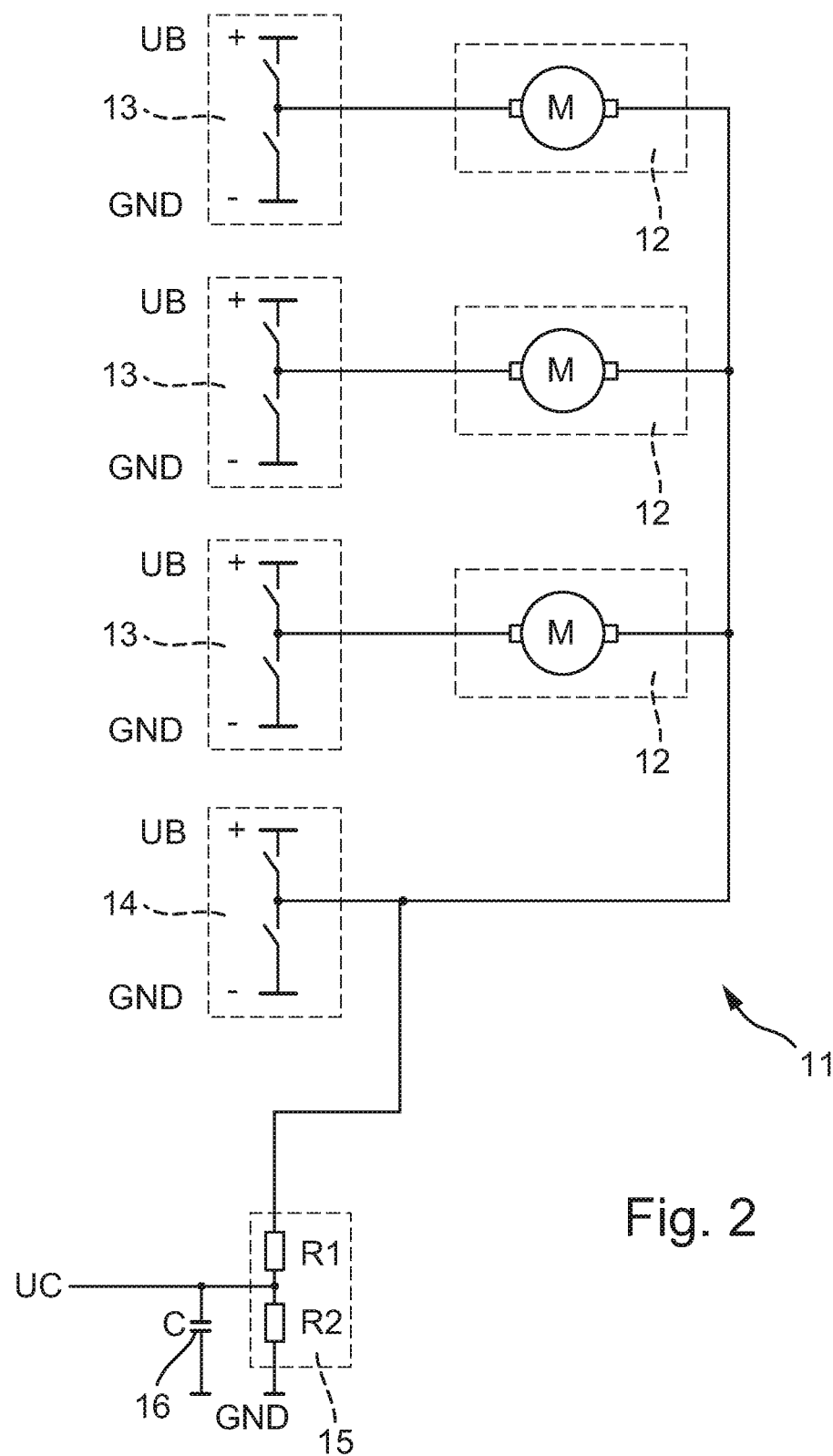
FIG. 2 is a schematic representation of a circuit arrangement of a second embodiment of a fault detection arrangement.

A circuit arrangement 11 shown in FIG. 2 functions in a rather similar manner and can also be used to carry out a fault detection process according to the invention.

In the circuit arrangement 11 a plurality of electric consumers formed by electro-motors M are switchably connected to a first potential UB, for example of an onboard power supply, and to a second potential GND, for example of an onboard supply unit, in a plurality of parallel branches 12, each comprising a first switch 13, via a common second switch 14.

The first switches 13 are each multiway switches, which can each produce a connection to the first potential UB or to the second potential GND. The common second switch 14 is also a multiway switch, which can optionally produce a connection to the second potential GND or to the first potential UB. It is therefore possible to reverse the running direction of the electro-motors M in the individual branches 12.

The first switch 13 of the respective branch 12 and the second switch 14 must be closed or actuated at the same time in order to operate the electro-motors M of the individual branches 12. Depending on the desired running direction of the electromotor M, the respective first switch 13 therefore produces a connection to one of the two potentials UB or GND and the second switch 14 produces a connection to the respective other potential GND or UB.

Fault detection is carried out when the electro-motors M in the respective branches 12 are visibly in the off state or idle state. In the idle state the rotor of an electromotor M therefore does not rotate and remains stationary.

A voltage divider 15 is also arranged parallel to the second switch 14 in the circuit arrangement 11. This too may consist of two ohmic resistors R1 and R2 connected in series, as shown schematically. The ohmic resistance of the voltage divider 15 produced by adding the individual resistances of the ohmic resistors R1 and R2 may, again, be from $10^4$ to $10^5 \Omega$, for example 501 kΩ in size. With electro-motors M, in particular with high-power electro-motors M, the ohmic resistance of the voltage divider 15 may be smaller in size. It is therefore ensured that a current flowing through a branch 12 between the first potential UB and the second potential GND is so small that the electro-motors M of the individual branches 12 remain in the idle state, even when the first switch 14 is closed to the first potential UB and the second switch 14 is open.

Also in the case of the circuit arrangement 11 in FIG. 2, a third electric potential UC is tapped at the voltage divider 15, as in the circuit arrangement 01 in FIG. 1. A reactance 16, for example formed by a capacitor C, may also be arranged between the third potential UC and the second potential GND. The reactance 16, preferably configured as a capacitor C, acts as a filter element, as a low-pass filter element in the embodiment.

A filter element is generally preferably provided, which preferably functions as a low-pass filter element and, for example as in the embodiments in FIGS. 1 and 2, may be configured as a capacitor C arranged between the third potential UC and the second potential GND, for example as an inductor arranged before the voltage divider 05, or between the voltage divider 05, 15 and the third potential or, for example as a combination hereof.

Fault detection is also carried out in the circuit arrangement 11 in FIG. 2, as in the circuit arrangement 01 in FIG. 1, by monitoring the third electric potential UC and the positions of the first switch 13 and the second switch 14. In this instance fault detection of the various fault types is carried out sequentially from branch 12 to branch 12.

The fault detection carried out by the circuit arrangement 11 can also identify the following fault types
 a) open load,
 b) consumer-side short circuit of the first switch 03 to the second potential GND,
 c) short circuit between the first switch 03 and the second switch 04,
 d) consumer-side short circuit of the first switch 03 to the first potential UB,
 e) consumer-side short circuit of the second switch 04 to the second potential GND, and
 f) consumer-side short circuit of the second switch 04 to the first potential UB.

Owing to the similarity of the principle of fault detection of the circuit arrangements 01 and 11 shown in FIGS. 1 and 2, there is no need for a detailed description of the process for detecting the various fault types in the circuit arrangement 11.

A noticeable difference between the fault detection carried out by the circuit arrangement shown in FIG. 2 relative to the circuit arrangement 01 shown in FIG. 1 is attributed to the fact that the electric consumers formed by electro-motors M are inductive consumers.

In the circuit arrangement 11 having inductive consumers formed by the electro-motors M arranged in the parallel branches 12, open load is detected by monitoring a change in the voltage of the third potential UC relative to the second potential GND when there is a change in the current through the electric consumer, in this case an electromotor M of a branch 12. A change in the current through an electromotor M of a branch 12 may be caused, for example when the second switch 14 is open and if the second switch 14 produces neither a connection to the first potential UB, nor a connection to the second potential GND, by closing (and producing a connection to the first potential UB) and then opening a first switch 13 of a branch 12.

In this instance, there is open load if, when the second switch 14 is open, a first switch 13 is closed to produce a connection to the first potential UB and the voltage of the third potential UC relative to the second potential GND remains unchanged when the first switch 13 is subsequently opened. The terminal of the same branch 12 is fine and there is no open load if, again starting from the open second switch 14, the first switch 13 is closed to produce a connection to the first potential UB and the voltage of the third potential UC relative to the second potential GND increases, at least momentarily, when the first switch 13 is subsequently opened.

In order to detect open load irrespective of the direction of actuation of a first switch 13 configured as a multiway switch, an ohmic resistor may be arranged on the consumer side between the second switch 14 and the first potential UB. A third switch may preferably be arranged in series with the ohmic resistor so as to avoid idle static power losses. If a third switch of this type is provided and closed, the ohmic resistor arranged on the consumer side between the second switch 14 and the first potential UB increases the rest potential that is prevalent on the consumer side of the second switch 14 to a value between the first potential UB and the second potential GND when the first switch 13 is off and the second switch 14 is off. The ohmic resistance preferably corresponds to the total resistance of the voltage divider 15. The increase in potential therefore corresponds to approximately half of the voltage between the first potential UB and the second potential GND. As a result of this measure, it is possible to detect open load, for example, irrespective of the direction of actuation of the first switch 13 configured as a multiway switch. Without the resistor arranged on the consumer side between the second switch 14 and the first potential UB, the rest potential that is prevalent on the consumer side of the second switch 14 would correspond or, if the third switch is open, does correspond to the second potential, since in these instances the voltage divider 15 impresses the second potential as rest potential on the consumer side of the second switch 14.

It is important to point out that in all the embodiments the third potential UC can be connected to the analogue-digital (AD) input of a microcontroller. It is also important to point out that, in addition to the first switches 03, 13, the second switches 04, 14 may also be configured as intelligent switches, each having a current monitoring circuit I with circuit breaker. The various fault types can therefore be better identified, above all in high-power electric consumers, such as electro-motors M. The electric consumers may generally be configured as capacitive consumers or may comprise consumers of this type. This applies, above all, if a capacitive consumer, for example formed by a capacitor, is not yet fully loaded. Examples of this include power buffers formed by capacitors and/or accumulators in electric circuits. These may also be integrated into electric consumers.

Advantages of the invention relative to the prior art emerge, inter alia, from the fact that, in the case of available driver components with power drives, minimum currents of the application required for various uses can be bypassed in order to safely detect open load. With the invention it is possible to fall below minimum current values of this type, without having to impose restrictions during fault detection of different fault types.

The invention is susceptible of industrial application, in particular in the field of producing check circuits for monitoring electric consumers in motor vehicles.

I claim:

1. Arrangement for fault detection of electric consumers in motor vehicles comprising at least one electric consumer switchably arranged between a first electric potential and a second electric potential, the electric consumer being switchably connected both to the first and to the second potential, a first switch being arranged between the first potential and the consumer and a second switch being arranged between the second potential and the consumer, and the first and second switches having to be closed at the same time in order to operate the consumer, wherein the first switch comprises a current monitoring circuit and fault detection is carried out when the consumer is visibly off, in that a voltage divider for tapping a third electric potential is arranged parallel to the second switch and fault detection is determined by evaluating the third electric potential and the positions of the first and second switches.

2. Arrangement for fault detection according to claim 1, characterized in that a reactance is arranged between the third potential and the second potential.

3. Method for fault detection according to claim 2, characterized in that the voltage divider is dimensioned in such a way that a current flowing through it and through a reactance, optionally arranged between the third and second potentials, is so small that the electric consumer, starting from an idle state present when the first and second switches are open, remains idle, at least visibly, by closing the first switch or the second switch.

4. Method for fault detection according to claim 3, characterized in that at least the ohmic resistance of the voltage divider is configured as 50 k$\Omega$.

5. Method for fault detection according to claim 1, characterized in that the electric consumer is an ohmic consumer or comprises a consumer of this type.

6. Method for fault detection according to claim 5, characterized in that, in order to detect open load, the first switch is closed and the second switch is opened, there being open load if the voltage of the third potential relative to the second potential is lower than a predetermined third voltage threshold value, and the terminal being fine if the voltage lies above a predetermined second voltage threshold value.

7. Method for fault detection according to claim 1, characterized in that the electric consumer is an inductive consumer or comprises a consumer of this type.

8. Method for fault detection according to claim 7, characterized in that, in order to detect open load, a change in the voltage of the third potential relative to the second potential is monitored when there is a change in the current through the electric consumer.

9. Method for fault detection according to claim 1, characterized in that a plurality of electric consumers are switchably connected to the second potential in a plurality of parallel branches, each comprising a first switch, via a common second switch.

10. Method for fault detection of electric consumers in motor vehicles comprising at least one electric consumer switchably arranged between a first electric potential and a second electric potential, the electric consumer being switchably connected both to the first and to the second potential, a first switch being arranged between the first potential and the consumer and a second switch being arranged between the second potential and the consumer, and the first and second switches having to be closed at the same time in order to operate the consumer, wherein in that the first switch comprises a current monitoring circuit and fault detection is carried out when the consumer is visibly off, in that a voltage divider for tapping a third electric potential is arranged parallel to the second switch and fault detection is determined by evaluating the third electric potential and the positions of the first and second switches, wherein the fault detection arrangement differentiates between the following different fault types:
   open load;
   consumer-side short circuit of the first switch to the second potential;
   short circuit between the first and second switches;
   consumer-side short circuit of the first switch to the first potential;
   consumer-side short circuit of the second switch to the second potential;
   consumer-side short circuit of the second switch to the first potential.

* * * * *